(12) United States Patent
Wei et al.

(10) Patent No.: US 11,331,883 B2
(45) Date of Patent: May 17, 2022

(54) DIFFUSION BARRIER STRUCTURE, AND CONDUCTIVE LAMINATE AND MANUFACTURING METHOD THEREOF

(71) Applicant: National Tsing Hua University, Hsinchu (TW)

(72) Inventors: Tzu-Chien Wei, Hsinchu (TW); Wei-Yen Wang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 279 days.

(21) Appl. No.: 16/510,208

(22) Filed: Jul. 12, 2019

(65) Prior Publication Data

US 2020/0101699 A1    Apr. 2, 2020

(30) Foreign Application Priority Data

Sep. 28, 2018  (TW) .................................. 107134388

(51) Int. Cl.
| | | |
|---|---|---|
| *B32B 15/20* | (2006.01) | |
| *B32B 3/10* | (2006.01) | |
| *B32B 15/082* | (2006.01) | |
| *B32B 27/30* | (2006.01) | |
| *B32B 7/12* | (2006.01) | |
| *H01L 21/768* | (2006.01) | |
| *B32B 27/28* | (2006.01) | |

(52) U.S. Cl.
CPC ................ *B32B 15/20* (2013.01); *B32B 3/10* (2013.01); *B32B 7/12* (2013.01); *B32B 15/082* (2013.01);
(Continued)

(58) Field of Classification Search
None
See application file for complete search history.

(56) References Cited

U.S. PATENT DOCUMENTS 2,970,150 A * 1/1961 Bailey .................. C10M 107/50
549/215
3,022,196 A * 2/1962 Jenkins .................... C09D 4/00
106/287.11
(Continued)

FOREIGN PATENT DOCUMENTS

| CN | 1877879 A | 12/2006 |
|---|---|---|
| CN | 103035608 A | 4/2013 |

(Continued)

OTHER PUBLICATIONS

Chin-Wei Hsu, et al., "Adhesive nickel-phosphorous electroless plating on silanized silicon wafer catalyzed by reactive palladium nanoparticles", IEEE Catalog No. CFP1559B-ART ISBN: 978-1-4673-8356-1.

*Primary Examiner* — Ramsey Zacharia
(74) *Attorney, Agent, or Firm* — Li & Cai Intellectual Property (USA) Office

(57) ABSTRACT

A diffusion barrier structure, and a conductive laminate and a manufacturing method thereof are provided. The conductive laminate includes a substrate, a diffusion barrier structure, and a conductive layer. The diffusion barrier structure is formed between the substrate and the conductive layer. The diffusion barrier structure includes a discontinuous modifying layer and a barrier layer. The discontinuous modifying layer is disposed on the substrate. A material for composing the discontinuous modifying layer is a polymer with hydrophilic group. The barrier layer is disposed on the substrate and the discontinuous modifying layer. A material for composing the barrier layer includes at least one self-healing polymer.

18 Claims, 5 Drawing Sheets

(52) U.S. Cl.
CPC .......... *B32B 27/283* (2013.01); *B32B 27/306* (2013.01); *B32B 27/308* (2013.01); *H01L 21/76841* (2013.01); *B32B 2264/105* (2013.01); *B32B 2307/302* (2013.01); *B32B 2307/762* (2013.01); *B32B 2457/00* (2013.01)

(56) References Cited

U.S. PATENT DOCUMENTS

| | | | |
|---|---|---|---|
| 3,636,637 A * | 1/1972 | Keith | B41F 23/0486 |
| | | | 34/255 |
| 7,705,346 B2 | 4/2010 | Birau et al. | |
| 2004/0121257 A1 | 6/2004 | Kaminsky et al. | |
| 2011/0262699 A1 | 10/2011 | Yializis et al. | |
| 2017/0077059 A1 | 3/2017 | Wei et al. | |
| 2018/0093455 A1* | 4/2018 | Zou | B32B 7/12 |

FOREIGN PATENT DOCUMENTS

| | | |
|---|---|---|
| CN | 103797162 A | 5/2014 |
| CN | 107245717 A | 10/2017 |
| TW | 200503121 A | 1/2005 |
| TW | 200525643 A | 8/2005 |
| TW | 201205750 A | 2/2012 |
| TW | 201621083 | 6/2016 |

* cited by examiner

DIFFUSION BARRIER STRUCTURE, AND CONDUCTIVE LAMINATE AND MANUFACTURING METHOD THEREOF

CROSS-REFERENCE TO RELATED PATENT APPLICATION

This application claims the benefit of priority to Taiwan Patent Application No. 107134388, field on Sep. 28, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a barrier structure, a conductive laminate and a manufacturing method thereof, and more particularly to a diffusion barrier structure, a conductive laminate and a manufacturing method thereof.

BACKGROUND OF THE DISCLOSURE

With the development of technology, integrated circuits (IC) continue to develop toward high density and high transmission efficiency. To enhance the performance of integrated circuits, the industry is dedicated to reducing the diameter of conductive wires and the distance between conductive wires, which may lead to deterioration of the resistive-capacitive delay (RC delay) problem. Therefore, to reduce the RC delay problem, in addition to selecting materials with low dielectric coefficient as a dielectric layer, copper with low resistivity and high capability of resisting migration of electrons is currently used as the material of conductive wires.

However, copper has high diffusivity, so copper atoms would diffuse into silicon elements in low temperature processes (e.g., 240° C.), causing performance degradation or damage to the silicon elements. Therefore, a copper diffusion barrier is usually disposed between a copper metal layer and a dielectric layer to obstruct the diffusion of copper atoms and maintain electrical reliability of the elements. Most of the current copper diffusion barriers use the nitride of a transition metal as the material, such as tantalum nitride or titanium nitride. Generally the copper diffusion barrier is formed onto the dielectric layer by dry processes.

However, the copper diffusion barrier layer manufactured by the dry processes usually has a large thickness (e.g., about 10 nm). According to the International Technology Roadmap for Semiconductors (ITRS), when the line-width ratio of integrated circuits is smaller than 16 nm, the thickness of the copper diffusion barrier should be less than 2 nm to reduce the influence caused by RC delay. Therefore, the customary copper diffusion barrier in the related art still needs to be improved.

SUMMARY OF THE DISCLOSURE

In response to the above-referenced technical inadequacies, the present disclosure provides a diffusion barrier structure, and a conductive laminate and manufacturing method thereof.

In one aspect, the present disclosure provides a diffusion barrier structure. The diffusion barrier structure is formed between a substrate and a conductive layer. The diffusion barrier structure includes a discontinuous modifying layer and a barrier layer. The discontinuous modifying layer is disposed on the substrate. The discontinuous modifying layer includes a polymer with hydrophilic group. The barrier layer is disposed on the substrate and the discontinuous modifying layer. The barrier layer includes at least one self-healing polymer.

In another aspect, the present disclosure provides a conductive laminate. The conductive laminate includes a substrate having a surface, a diffusion barrier structure, and a conductive layer. The diffusion barrier structure is disposed on the substrate. The diffusion barrier structure includes a discontinuous modifying layer and a barrier layer. The discontinuous modifying layer is disposed on the surface of the substrate. The discontinuous modifying layer includes a polymer with hydrophilic group. The barrier layer is disposed on the surface of the substrate and the discontinuous modifying layer. The barrier layer includes at least one self-healing polymer. A conductive layer is disposed on the substrate. The conductive layer is separated from the substrate by the diffusion barrier structure.

In still another aspect, the present disclosure provides a method for manufacturing a conductive laminate. The method for manufacturing the conductive laminate includes steps of: providing a substrate having a surface; performing a surface modification on the surface of the substrate so as to form a discontinuous modifying layer on the surface of the substrate; forming a barrier layer on the surface and the discontinuous modifying layer; and forming a conductive layer on a surface of the barrier layer. The discontinuous modifying layer includes a polymer with hydrophilic group, and the barrier layer includes a self-healing polymer.

Therefore, the diffusion barrier structure, the conductive laminate and the manufacturing method thereof of the present disclosure have the technical features of "the discontinuous modifying layer having the polymer with hydrophilic group" and "the barrier layer having the self-healing polymer" to obstruct metal atoms in the conductive layer from diffusing into the substrate.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
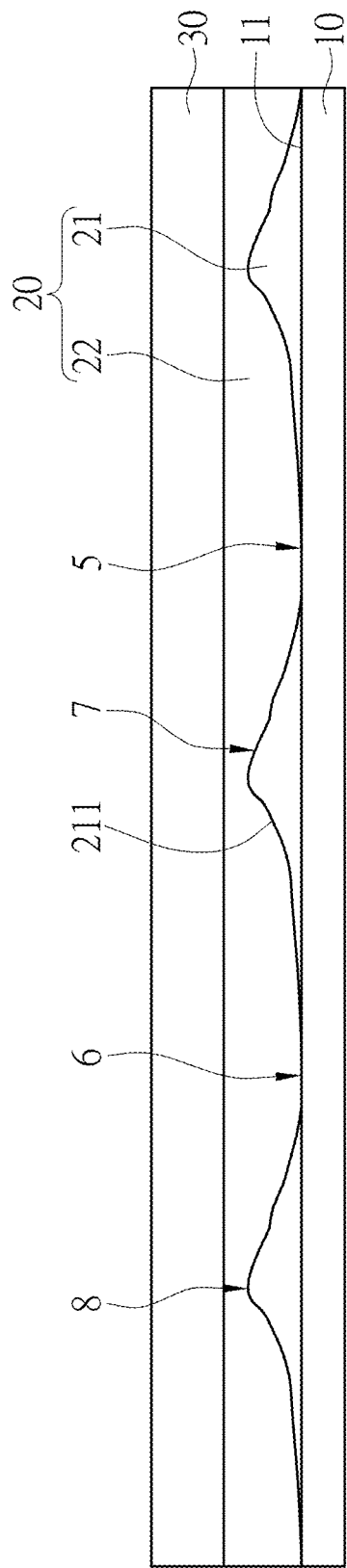
FIG. 1 is a side cross-sectional schematic view of a conductive laminate of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, a conductive laminate 1 is provided in the present disclosure. The conductive laminate 1 includes a substrate 10, a diffusion barrier structure 20, and a conductive layer 30.

The diffusion barrier structure 20 is disposed between the substrate 10 and the conductive layer 30. The diffusion barrier structure 20 could obstruct metal atoms from diffusing into the substrate 10 within a specific temperature range. Therefore, the existence of the diffusion barrier structure 20 could help prevent the conductive laminate 1 from performance degradation or damage due to the rise of temperature when processing the conductive laminate 1.

The substrate 10 may be an inorganic substrate or an organic substrate, but is not limited thereto. In the present embodiment, as an example, the material of the substrate 10 is inorganic, and is silicon dioxide. Generally, to enhance the conduction efficiency of the conductive laminate 1, high conductivity copper is used as the material of the conductive layer 30. Therefore, as an example, the material of the conductive layer 30 is copper in the present disclosure.

In this embodiment, the diffusion barrier structure 20 includes a discontinuous modifying layer 21 and a barrier layer 22. The discontinuous modifying layer 21 is disposed on a surface 11 of the substrate 10. After disposing the discontinuous modifying layer 21 on the surface 11 of the substrate 10, a top surface of the substrate 10 becomes a nano-rough surface 211 with a few height differences instead of a flat surface.

The formation of the nano-rough surface 211 results from an incomplete modification on the surface 11 of the substrate 10. As shown in FIG. 1, some areas on the surface 11 of the substrate 10 has no modifying layer (e.g., the area 5 and 6), and some areas on the surface 11 of the substrate 10 has island-shaped modifying layers (e.g., the area 7 and 8). The nano-rough surface 211 includes some unmodified areas (e.g., area 5 and 6, which are without modifying layers) and some modified areas (e.g., area 7 and 8, which are with the island-shaped modifying layers), and thus there are some height differences on the top surface of the substrate 10.

In this embodiment, not the whole surface 11 of the substrate 10 is modified; instead, only some areas on the surface 11 of the substrate 10 are modified. The modifying layers do not completely cover the surface 11 of the substrate 10, but is adsorbed to the surface 11 of the substrate 10 in an island-shaped form. For easy reference, the modified areas (e.g., area 5 and 6) and the island-shaped modified areas (e.g., area 7 and 8) in the present disclosure are as a whole referred to as a discontinuous modifying layer 21. The discontinuous modifying layer 21 is beneficial to the disposition of the barrier layer 22.

The material for composing the discontinuous modifying layer 21 includes a polymer with hydrophilic group. For example, the polymer with hydrophilic group may be a silane with amino group and the number of the amino group may be 1 to 3. For example, the silane with amino group may be (3-aminopropyl)triethoxysilane (APTES), N-(3-(trimethoxysilyl)propyl)ethylenedi amine, 3-2-(2-aminoethylamino)ethylamino propyl trimethoxysilane (ETAS), or any combination thereof, but not limited thereto. In a preferable embodiment, the polymer with hydrophilic group is 3-2-(2-aminoethylamino)ethylamino propyl trimethoxysilane. That is, the polymer with hydrophilic group is a silane with three amino groups. The barrier layer 22 is disposed on the surface 11 of the substrate 10 and the discontinuous modifying layer 21. The barrier layer 22 is arranged above the nano-rough surface 211 with a few height differences of the discontinuous modifying layer 21. The barrier layer 22 could obstruct the metal atoms in the conductive layer 30 from diffusing into the substrate 10 within a specific temperature range.

The material for composing the barrier layer 22 includes a self-healing polymer. The self-healing polymer may be selected from the group consisting of: polyvinyl alcohol (PVA), polyvinylpyrrolidone (PVP), polyacrylic acid (PAA), polyethylene glycol (PEG), and any combination thereof. In the embodiment, the self-healing polymer is polyvinyl alcohol.

In another embodiment, besides the self-healing polymer, the material for composing the barrier layer 22 further includes a catalytic material. The catalytic material is encapsulated in the self-healing polymer. Utilization of the catalytic material is beneficial to the formation of the conductive layer 30 on the barrier layer 22. In the embodiment, the catalytic material includes a plurality of metallic nanoparticles. The metallic nanoparticles may be palladium nanoparticles.

Generally, the operation of rapid thermal annealing (RTA) can be used to release an internal stress of metal in the conductive laminate 1 during processing. Meanwhile, rising of temperature during processing may increase the diffusivity of metal atoms from the conductive layer 30 to the substrate 10, which causes some metal atoms (usually being copper atoms) in the conductive layer 30 to diffuse into the substrate 10. Once some metal atoms diffuse into the barrier layer 20, the diffused metal atoms will produce a stimulus to the self-healing polymer and drive the self-healing polymer to block the diffusion path of the metal atoms and achieve the effect of obstructing further diffusion of metal atoms. Therefore, the inclusion of the diffusion barrier structure 20 could help obstruct the diffusion of the metal atoms within a specific temperature range.

Figure 2:
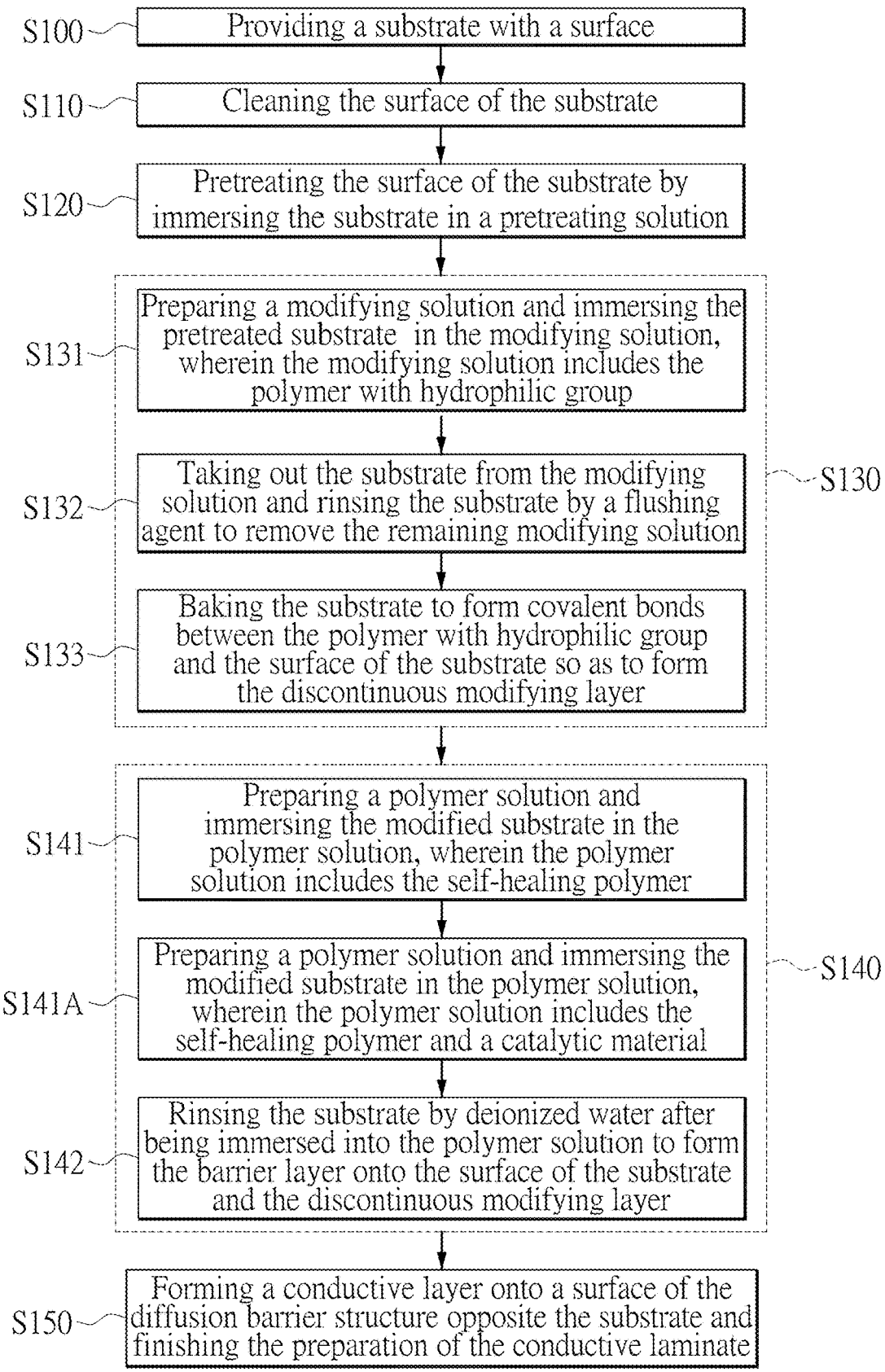
FIG. 2 is a flowchart of a method for manufacturing the conductive laminate of the present disclosure.

FIG. 2 is a flow chart of a method for manufacturing the conductive laminate 1. Referring to FIG. 1 and FIG. 2, in the step S100, a substrate 10 with a surface 11 is provided.

In step S110, the surface 11 of the substrate 10 is cleaned. In the embodiment, the surface 11 of the substrate 10 is cleaned by a standard wet cleaning method (RCA clean). The organic compounds, metallic compounds, and ionic compounds attached on the surface 11 of the substrate 10 are thus removed. Subsequently, the surface 11 of the substrate 10 is rinsed by deionized water and is blown dry to be in a dry state.

Two reagents, RCA-1 and RCA-2, are used in the standard wet cleaning method. Compositions of the RCA-1 reagent include ammonia water ($NH_4OH$), hydrogen peroxide ($H_2O_2$), and deionized water (DI). The RCA-1 reagent is also known as ammonia hydrogen peroxide mixtures (APM) to remove organic compounds attached onto surfaces. Compositions of the RCA-2 reagent include hydrochloric acid (HCl), hydrogen peroxide, and deionized water. The RCA-2 reagent is also known as hydrochloric acid hydrogen peroxide mixtures (HPM) to remove metallic compounds attached onto surfaces. In the embodiment, the cleaning steps are illustrated below. The substrate 1 is immersed in the APM solution for 20 minutes at 80° C. The volume ratio of $NH_4OH:H_2O_2:DI$ in the APM solution is 1:1:5. In step S120, the surface 11 of the substrate 10 is pretreated by immersing the substrate 10 in a pretreating solution. In the embodiment, the pretreating solution is pure isopropanol (IPA) and the substrate 10 is immersed in the pretreating solution for 5 minutes. It is noted that the choice of the pretreating solution depends on the modifying solution. In another embodiment, the pretreating solution may be toluene, acetone, ethanol, isopropanol, or any combination thereof.

Subsequently, the surface 11 of the substrate 10 undergoes surface modification to form a discontinuous modifying layer 21 on the surface 11. The material for composing the discontinuous modifying layer 21 includes a polymer with hydrophilic group (step S130).

The polymer with hydrophilic group may be a silane with amino group. For example, the silane with amino group may be selected from the group consisting of: (3-aminopropyl)triethoxysilane, N-(3-(trimethoxysilyl)propyl)ethylenediamine, 3-2-(2-aminoethylamino)ethylamino propyl trimethoxysilane, or any combination thereof, but is not limited thereto. In a preferable embodiment, the polymer with hydrophilic group is 3-2-(2-aminoethylamino)ethylamino propyl trimethoxysilane. That is, the polymer with hydrophilic group is a silane with three amino groups.

In the embodiment, the surface modification includes the steps of preparing a modifying solution and immersing the pretreated substrate 10 in the modifying solution, wherein the modifying solution includes the polymer with hydrophilic group (step S131). Therefore, after the surface modification, the material for composing the discontinuous modifying layer 21 includes the polymer with hydrophilic group.

When processing the surface modification, the substrate 10 is immersed in the modifying solution for 0.5 to 5 minutes. In a preferable embodiment, the substrate 10 is immersed in the modifying solution for 1 minute.

In a traditional wet process for surface modification, the time required for immersing the substrate 10 in the modifying solution should be at least 30 minutes so the polymer with hydrophilic group could successfully attached onto the surface 11 of the substrate 10 and form a complete monolayer chemical adsorption. Accordingly, the traditional wet process has the disadvantage of requiring long operation time.

However, in this embodiment, since a continuous modifying layer is not necessary, the substrate 10 only needs to be immersed in the modifying solution for surface modification for a short period of time. Once the island-shaped discontinuous modifying layer 21 is formed on the substrate 10, the barrier layer 22 could be formed on the substrate 10 to obstruct the diffusion of metal atoms. Therefore, the modifying time (to form the discontinuous modifying layer 21) of the present disclosure is much shorter (only 0.5-5 minutes) than the modifying time in a traditional wet process (at least 30 minutes).

In the embodiment, the modifying solution is a silane solution. The amount of silane in the silane solution ranges from 0.1 volume % (vol %) to 5 vol %. In a preferable embodiment, the amount of silane in the silane solution is 1 vol %.

In a preferable embodiment, a component of the pretreating solution in step S120 and a component of the modifying solution in step S131 are the same. In other words, in addition to the polymer with hydrophilic group, the modifying solution further includes a solvent dispersing the polymer with hydrophilic group. Moreover, the solvent of the modifying solution and the pretreating solution are the same. In the embodiment, the pretreating solution is isopropanol and the solvent dispersing the polymer with hydrophilic group of the modifying solution also is isopropanol. In other words, when the substrate 10 is pretreated in step S120, a few isopropanol molecules are adsorbed onto the surface 11 of the substrate 10. Therefore, when the substrate 10 undergoes surface modification in step S131, the solvent of the modifying solution is also isopropanol, so the polymer with hydrophilic group could be easily attached onto the surface 11 of the substrate 10.

In another embodiment, the solvent of the modifying solution may be toluene, acetone, ethanol, isopropanol, or any combination thereof. In the present disclosure, toluene, acetone, ethanol, and isopropanol are respectively selected to be the solvent of the modifying solution. In one embodiment, after the discontinuous modifying layer 21 is formed, an arithmetical mean deviation (Ra.) of the nano-rough surface 211 of the discontinuous modifying layer 21 is measured by atomic force microscope (AFM). Measured results are shown in Table 1 below.

TABLE 1 the arithmetical mean deviations (Ra.) of the discontinuous modifying layers formed by being immersed in the modifying solution with different solvents.

| | Solvent of the modifying solution | | | |
|---|---|---|---|---|
| | Toluene | Acetone | Ethanol | Isopropanol |
| Ra. of the discontinuous modifying layer | 0.340 nm | 0.144 nm | 0.243 nm | 0.126 nm |

For comparison, the substrate 10 without the discontinuous modifying layer 21 is also measured by AFM and the arithmetical mean deviation of the substrate 10 without the discontinuous modifying layer 21 which acts as a benchmark is 0.106 nm. According to Table 1, different solvents of the modifying solution will influence the structure of the discontinuous modifying layer 21. The discontinuous modifying layer 21 formed by using isopropanol as the solvent of the modifying solution has a smaller arithmetical mean deviation so that the barrier layer 22 is easier to form onto the discontinuous modifying layer 21.

In step S132, the substrate 10 is taken out from the modifying solution and is rinsed by a flushing agent to remove the remaining modifying solution. In the embodiment, the flushing agent and the solvent of the modifying solution are the same, that is, the flushing agent is pure isopropanol.

In step S133, the substrate 10 is baked. Covalent bonds are formed between the surface 11 of the substrate 10 and the polymer with hydrophilic group, and the discontinuous modifying layer 21 is formed onto the substrate 10. Therefore, the surface 11 of the substrate 10 is modified to be hydrophilic via the discontinuous modifying layer 21. In the embodiment, the substrate 10 is baked in an oven at 160° C.

Subsequently, a barrier layer 22 is formed on the surface 11 of the substrate 10 and the discontinuous modifying layer 21. The material for composing the barrier layer 22 includes a self-healing polymer. The self-healing polymer is selected from the group consisting of: polyvinyl alcohol, polyvinylpyrrolidone, polyacrylic acid, polyethylene glycol, and any combination thereof (step S140).

In the embodiment, a polymer solution is prepared and the modified substrate 10 is immersed in the polymer solution to form the barrier layer 22, where the polymer solution includes a self-healing polymer. In the embodiment, the self-healing polymer is polyvinyl alcohol. That is, the polymer solution includes polyvinyl alcohol. Furthermore, the average diameter of the self-healing polymer ranges from 5 nm to 15 nm.

In other embodiments, in addition to the self-healing polymer, the material for composing the barrier layer 22 further includes a catalytic material. Therefore, in step S141 A, a polymer solution is prepared and the modified substrate 10 is immersed in the polymer solution to form the barrier layer 22, where the polymer solution includes a self-healing polymer and a catalytic material. In a preferable embodiment, the catalytic material is metallic nanoparticles. More preferably, the metallic nanoparticles are palladium nanoparticles.

The inclusion of the metallic nanoparticles in the barrier layer 22 is beneficial to forming a conductive layer 30 onto the barrier layer 22. Generally, when adopting the electroless plating for metal deposition, a catalyst is usually needed. Therefore, the metallic nanoparticles added in the barrier layer 22 of the present disclosure can be used as the catalyst for the conductive layer 30.

In an embodiment of the present disclosure, the polymer solution includes palladium nanoparticles encapsulated by the polyvinyl alcohol (abbreviated as PVA-Pd particles). The specific steps of preparing the PVA-Pd particles are described below. The self-healing polymer (such as polyvinyl alcohol), a precursor (such as palladium nitrate), a reductant (such as aldehyde), and an alkaline solution (such as sodium carbonate solution) are sequentially added in a stirring deionized water at room temperature to form a polymeric nanoparticle cluster. The precursor is reduced into zero valence metallic nanoparticles by the reductant in an alkaline environment. The self-healing polymer is attached around the metallic nanoparticles. The steric barrier of the self-healing polymer could prevent the metallic nanoparticles from clustering or settling.

By adjusting the weight of the self-healing polymer and the weight of the precursor, the weight ratio of the polyvinyl alcohol to the palladium nanoparticles in the PVA-Pd particles (abbreviated as weight ratio of PVA:Pd) may range from 0.175:1 to 5:1. In the embodiment, the PVA-Pd particles with the weight ratios of PVA:Pd of 0.175:1, 0.5:1, 1:1, and 2:1 are prepared. In a preferable embodiment, the weight ratio of PVA:Pd of the PVA-Pd particles ranges from 0.5:1 to 2:1. The average diameter of the PVA-Pd particles in the polymer solution ranges from 6 nm to 9 nm.

In step S142, the substrate 10 is rinsed by deionized water after being immersed into the polymer solution and a barrier layer 22 is formed on the surface 11 of the substrate 10 and the discontinuous modifying layer 21.

In step S150, a conductive layer 30 is formed on a surface of the diffusion barrier structure 20. In the embodiment, the conductive layer 30 is formed on the diffusion barrier structure 20 by electroless plating to finish the preparation of the conductive laminate 1 as shown in FIG. 3.

Figure 3:
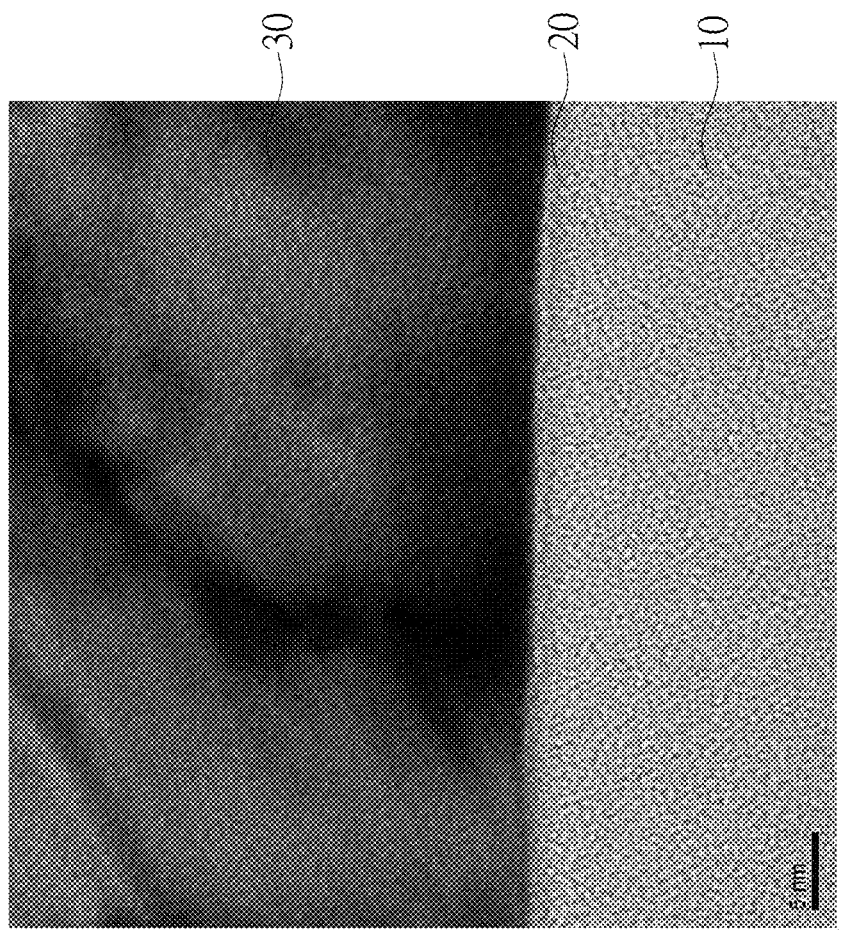
FIG. 3 is a microscopic image of the conductive laminate of the present disclosure.

FIG. 3 is a microscopic image of the conductive laminate 1 captured by transmission electron microscope image (TEM). The diffusion barrier structure 20 (dark gray portion) is disposed between the substrate 10 (gray white portion) and the conductive layer 30 (black portion). According to a proportional scale shown in the microscopic image, a total thickness of the diffusion barrier structure 20 of the present disclosure is much less than 5 nm. Further, the total thickness of the diffusion barrier structure 20 is less than 2 nm.

Figure 4:
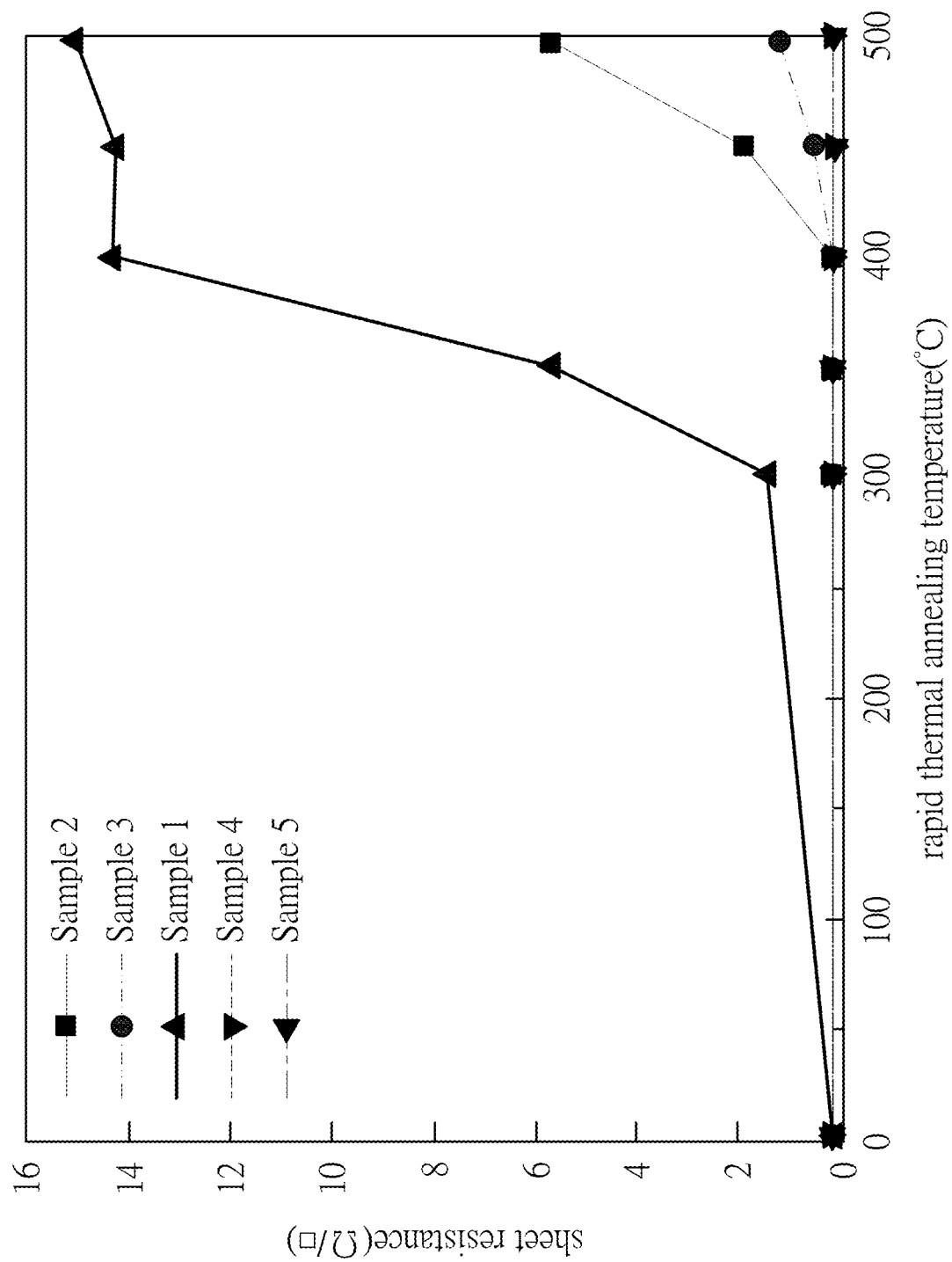
FIG. 4 shows sheet resistances of the conductive laminate in which a conductive layer is disposed on a substrate in different ways at different rapid thermal annealing temperatures.
Figure 5:
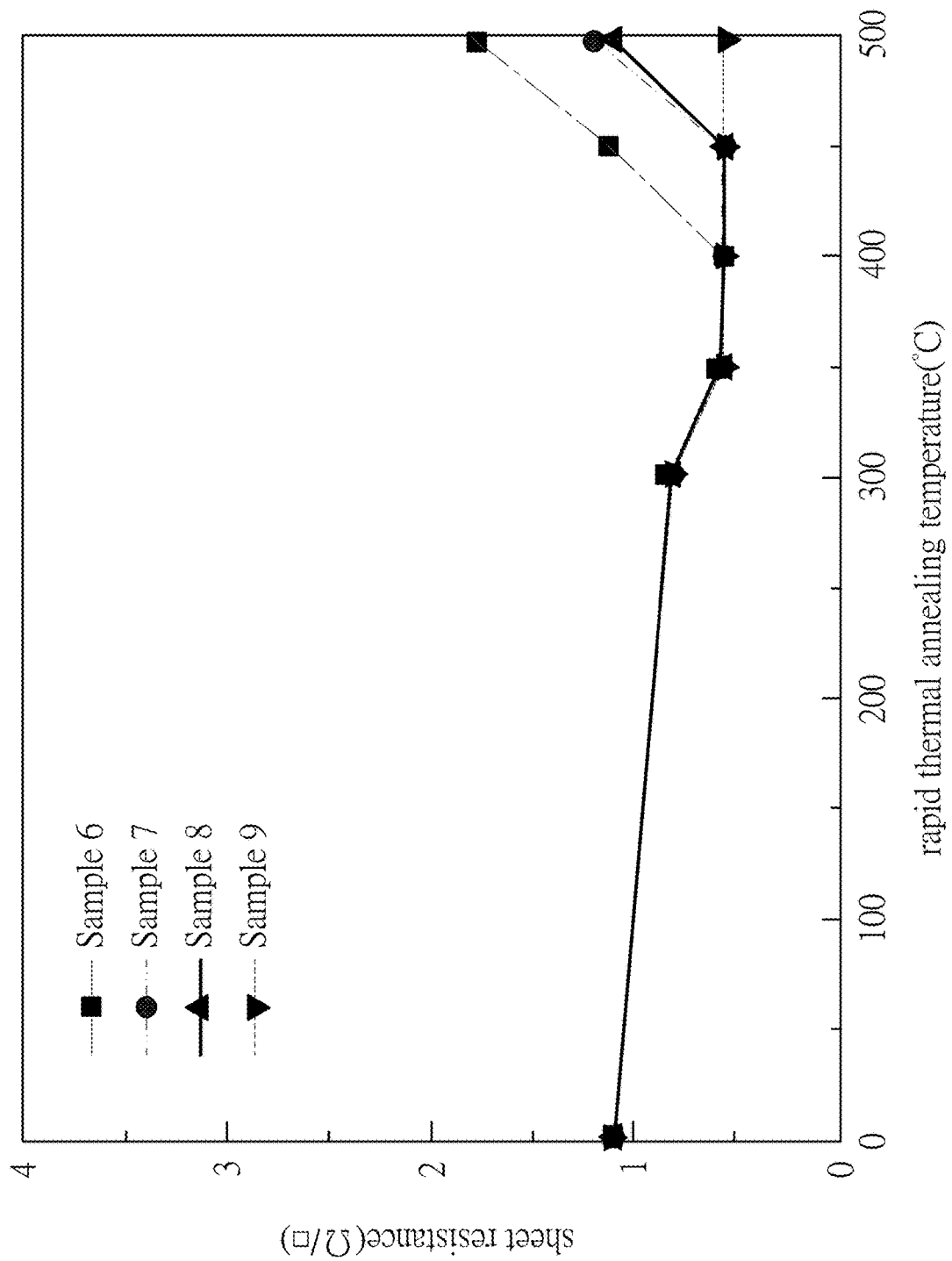
FIG. 5 shows sheet resistances of the conductive laminate in which the conductive layer is disposed on the substrate in different ways at different rapid thermal annealing temperatures.

To make sure the diffusion barrier structure 20 of the embodiment is able to prevent copper atoms of the conductive layer 30 from diffusing into the substrate 10, a sheet resistance test is performed with samples 1 to 9 by a four-point probe to obtain the sheet resistance at different environmental temperatures. Results of the sheet resistance are shown in FIG. 4 and FIG. 5, which can be equated to the diffusion extent of copper atoms of the conductive layer 30. Generally, as the copper atoms diffuse into the substrate 10, the electrical characteristic of the conductive laminate 1 will change and the sheet resistance of the conductive laminate 1 will increase.

Referring to FIG. 4, the conductive layer 30 of sample 1 is directly disposed on the substrate 10, that is, sample 1 does not have the diffusion barrier structure 20 as disclosed in the embodiments. The conductive layers 30 of sample 2 and sample 3 are connected to the substrate 10 via the discontinuous modifying layer 21 and without the barrier layer 22. The difference between sample 2 and sample 3 is that the surface modification is respectively processed for 1 minute (sample 2) and for 30 minutes (sample 3). The conductive layers 30 of sample 4 and sample 5 are connected to the substrate 10 via the diffusion barrier structure 20 (including both the discontinuous modifying layer 21 and the barrier layer 22), where the barrier layer 22 only includes the self-healing polymer (polyvinyl alcohol) without the metallic nanoparticles. The difference between sample 4 and sample 5 is that the surface modification process is respectively conducted for 1 minute (sample 4) and for 30 minutes (sample 5).

Based on the results of FIG. 4, the discontinuous modifying layer 21 (sample 2) or continuous modifying layer (sample 3) disposed between the substrate 10 and the conductive layer 30 could slightly obstruct the diffusion of copper atoms. Further, the conductive laminate 1 with the continuous modifying layer has a better diffusion barrier effect than the conductive laminate 1 with the discontinuous modifying layer 21. However, the time required for forming the continuous modifying layer is much longer than the time required for forming the discontinuous modifying layer. Aside from the discontinuous modifying layer 21 or continuous modifying layer, if the barrier layer 22 is further disposed between the substrate 10 and the conductive layer 30 (sample 4 and sample 5), that is, the diffusion barrier structure 20 is disposed between the substrate 10 and the conductive layer 30, the conductive laminate 1 will have better diffusion barrier effect. In addition, the conductive laminate 1 could have good diffusion barrier effect regardless of whether the discontinuous modifying layer 21 or the continuous modifying layer is disposed, and could have stable sheet resistance even if the environmental temperature reaches 500° C.

Accordingly, the inclusion of the diffusion barrier structure 20 could obstruct copper atoms from diffusing into the substrate 10. Further, the processing time of surface modification (for forming of the discontinuous modifying layer 21) of the present disclosure is short. Therefore, the methods of manufacturing the diffusion barrier structure 20 and conductive laminate 1 have an advantage of short processing time.

In addition, the material for composing the barrier layer 22 may include both the self-healing polymer and the catalytic material. Therefore, to compare the influences of different compositions of the barrier layer 22 in the diffusion barrier structure 20 on the diffusion barrier effect, sheet resistance tests are conducted on the conductive laminate 1 with different compositions of the barrier layers 22. Referring to FIG. 5, the conductive laminate 1 of sample 6 to sample 9 all have the diffusion barrier structure 20. The difference among the conductive laminate 1 of sample 6 to sample 9 is that the weight ratios of PVA:Pd in the material of the barrier layer 22 of the conductive laminate 1 of sample 6 to sample 9 are sequentially 0.175:1 (sample 6), 0.5:1 (sample 7), 1:1 (sample 8), and 2:1 (sample 9).

According to the result of FIG. 5, when the amount of polyvinyl alcohol contained in the barrier layer 22 is larger, the diffusion barrier effect for the copper atoms of the conductive laminate 1 is better. The sheet resistance of the conductive laminate 1 could be stable at high environmental temperature. Specifically, when the weight ratio of the PVA:Pd of the PVA-Pd particles ranges from 0.175:1 to 2:1, the conductive laminate 1 could bear the processing temperature up to 400° C. When the weight ratio of the PVA:Pd of the PVA-Pd particles ranges from 0.5:1 to 2:1, the conductive laminate 1 could bear the processing temperature up to 450° C. When the weight ratio of the PVA:Pd of the PVA-Pd particles is 2:1, the conductive laminate 1 could bear the processing temperature up to 500° C.

Moreover, when the material composing the barrier layer 22 includes both the self-healing polymer and the catalytic material, and the diffusion barrier structure 20 could not only obstruct the diffusion of the copper atoms but also enhance an adhesive force between the conductive layer 30 and the substrate 10. In the following illustration, the conductive laminate 1 is processed with rapid thermal annealing process at 400° C. and the adhesive force between the conductive layer 30 and the substrate 10 is subsequently measured. The conductive laminate 1 could be manufactured by different methods of operation as shown in Table 2 to dispose the conductive layer 30 on the substrate 10, and the adhesive force is measured by two standards described below.

Firstly, according to the standard ASTM D3359 test defined by American Society for Testing and Materials (ASTM), a surface of the conductive laminate 1 is cut into lattice pattern and a special tape is applied onto the conductive laminate 1 to perform an adhesive test and measure the adhesive level of the thin film (abbreviated as a tape test). In addition, an adhesive force test is also performed on the conductive laminate 1 according to the standard ASTM D4541 test and the standard ASTM D7234 test (abbreviated as adhesive force test). Results of the tape test and the adhesive force test are shown in Table 2.

TABLE 2 results of the tape test and the adhesive force test of the conductive laminates with different manufacturing conditions.

| Manufacturing conditions of conductive laminate | Tape test | Adhesive force test |
|---|---|---|
| A copper conductive layer being directly disposed on the substrate by chemical vapor deposition (CVD) without the diffusion barrier layer | X | 3.03 MPa |
| A tantalum nitride layer being disposed on the substrate, and the copper conductive layer being disposed on the tantalum nitride layer by CVD | PASS | >20 MPa |
| The substrate being immersed in 1 vol % ETAS/IPA modifying solution for 1 minute to form a discontinuous modifying layer, and the copper conductive layer being formed on the discontinuous modifying layer by electroless plating, and without the barrier layer | PASS | 5.12 MPa |
| The substrate being immersed in 1 vol % ETAS/IPA modifying solution for 30 minutes to form a continuous modifying layer, and the copper conductive layer being formed on the continuous modifying layer by electroless plating, and without the barrier layer | PASS | 5.68 MPa |
| The substrate being immersed in 1 vol % ETAS/IPA modifying solution for 1 minute to form the discontinuous modifying layer, the weight ratio of the PVA:Pd in the barrier layer being 0.175:1, and the copper conductive layer being formed on the barrier layer by electroless plating | PASS | 6.21 MPa |

TABLE 2-continued results of the tape test and the adhesive force test of the
conductive laminates with different manufacturing conditions.

| Manufacturing conditions of conductive laminate | Tape test | Adhesive force test |
|---|---|---|
| The substrate being immersed in 1 vol % ETAS/IPA modifying solution for 30 minutes to form the continuous modifying layer, the weight ratio of the PVA:Pd in the barrier layer being 0.175:1, and the copper conductive layer being formed on the barrier layer by electroless plating | PASS | 7.31 MPa |
| The substrate being immersed in 1 vol % ETAS/IPA modifying solution for 1 minute to form the discontinuous modifying layer, the weight ratio of the PVA:Pd in the barrier layer being 0.5:1, and the copper conductive layer formed on the barrier layer by electroless plating | PASS | 6.39 MPa |
| The substrate being immersed in 1 vol % ETAS/IPA modifying solution for 30 minutes to form the continuous modifying layer, the weight ratio of the PVA:Pd in the barrier layer being 0.5:1, and the copper conductive layer being formed on the barrier layer by electroless plating | PASS | 9.85 MPa |
| The substrate being immersed in 1 vol % ETAS/IPA modifying solution for 1 minute to form the discontinuous modifying layer, the weight ratio of the PVA:Pd in the barrier layer being 1:1, and the copper conductive layer being formed on the barrier layer by electroless plating | PASS | 10.23 MPa |
| The substrate being immersed in 1 vol % ETAS/IPA modifying solution for 30 minutes to form continuous modifying layer, the weight ratio of the PVA:Pd in the barrier layer being 1:1, and the copper conductive layer being formed on the barrier layer by electroless plating | PASS | 9.61 MPa |
| The substrate being immersed in 1 vol % ETAS/IPA modifying solution for 1 minute to form the discontinuous modifying layer, the weight ratio of the PVA:Pd in the barrier layer being 2:1, and the copper conductive layer being formed on the barrier layer by electroless plating | PASS | 2.67 MPa |
| The substrate being immersed in 1 vol % ETAS/IPA modifying solution for 30 minutes to form continuous modifying layer, the weight ratio of the PVA:Pd in the barrier layer being 2:1, and the copper conductive layer being formed on the barrier layer by electroless plating | PASS | 4.34 MPa |

According to Table 2, inclusion of the catalytic material in the diffusion barrier layer 22 makes the conductive laminate 1 have appropriate adhesive force (2.5 MPa to 15 MPa). The conductive layer 30 may be formed onto the diffusion barrier layer 22 by electroless plating without disposing an adhesive layer between the diffusion barrier layer 22 and the conductive layer 30. Therefore, the diffusion barrier layer 22 has the effects of obstructing diffusion of metal atoms and adhering to the conductive layer 30. Further, the adhesive force of the conductive layer 30 ranges from 6 MPa to 15 MPa when the weight ratio of PVA:Pd ranges from 0.5:1 to 1:1.

In conclusion, the diffusion barrier structure 20, and the conductive laminate 1 and manufacturing method thereof of the present disclosure have technical features of "the inclusion of the discontinuous layer 21" and "the inclusion of the barrier layer 22" to overcome defects existing in traditional metal diffusion barrier layers. The diffusion barrier structure 20 can obstruct metal atoms in the conductive layer 30 from diffusing into the substrate 10, increase the bearing temperature of the conductive laminate 1 during processing, and maintain electrical performance of the conductive laminate 1. In addition, the diffusion barrier structure 20 manufactured by wet process has a much smaller thickness. Even if the processing time is shortened, the surface 11 of the substrate 10 could still be modified to achieve desired performance.

Further, the barrier layer 22 of the present disclosure further includes catalytic material. The catalytic material is beneficial to form the conductive layer 30 onto the diffusion barrier structure 20 with strong adhesive force. The adhesive force of the conductive layer 30 may be further optimized by regulating the weight ratio of the self-healing polymer to the catalytic material.

As disclosed in the above embodiments, since the present disclosure only needs a discontinuous modifying layer instead of a continuous modifying layer, and a discontinuous modifying layer 21 could be formed in a much shorter period of time, the present disclosure is superior to the traditional method.

Accordingly, the diffusion barrier structure 20, and conductive laminate 1 and manufacturing method thereof of the present disclosure have the technical features of "the discontinuous modifying layer 21 having the polymer with hydrophilic group" and "the barrier layer 22 having the self-healing polymer" to obstruct metal atoms in the conductive layer 30 from diffusing into the substrate 10.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A diffusion barrier structure formed between a substrate and a conductive layer, comprising:
   a discontinuous modifying layer disposed on the substrate, and a material for composing the discontinuous modifying layer including a silane with a hydrophilic group; and
   a barrier layer disposed on the substrate and the discontinuous modifying layer, and a material for composing the barrier layer including at least one self-healing polymer; wherein the self-healing polymer is selected from the group consisting of: polyvinyl alcohol, polyvinylpyrrolidone, polyacrylic acid, polyethylene glycol, and any combination thereof.

2. The diffusion barrier structure according to claim 1, wherein the silane with the hydrophilic group is a silane with an amino group.

3. The diffusion barrier structure according to claim 2, wherein the silane with the amino group is selected from the group consisting of: (3-aminopropyl)triethoxysilane, N-(3-(trimethoxysilyl)propyl)ethylenediamine), 3-2-(2-aminoethylamino)ethylamino propyl trimethoxysilane, and any combination thereof.

4. The diffusion barrier structure according to claim 1, wherein the barrier layer further includes a catalytic material.

5. The diffusion barrier structure according to claim 4, wherein the catalytic material is metallic nanoparticles.

6. The diffusion barrier structure according to claim 4, wherein a weight ratio of the self-healing polymer to the catalytic material in the barrier layer is from 0.175:1 to 2:1.

7. The diffusion barrier structure according to claim 4, wherein the catalytic material is encapsulated in the self-healing polymer.

8. The diffusion barrier structure according to claim 1, wherein a total thickness of the diffusion barrier structure is less than 5 nm.

9. A conductive laminate, comprising:
   a substrate having a surface;
   a diffusion barrier structure formed on the substrate, the diffusion barrier structure including a discontinuous modifying layer and a barrier layer, the discontinuous modifying layer disposed on the surface of the substrate, a material composing the discontinuous modifying layer including a silane with a hydrophilic group, the barrier layer disposed on the surface of the substrate and the discontinuous modifying layer, and a material composing the barrier layer including at least one self-healing polymer; wherein the self-healing polymer is selected from the group consisting of: polyvinyl alcohol, polyvinylpyrrolidone, polyacrylic acid, polyethylene glycol, and any combination thereof; and
   a conductive layer disposed on the substrate, wherein the conductive layer is separated from the substrate by the diffusion barrier structure.

10. The conductive laminate according to claim 9, wherein the material of the barrier layer further includes a catalytic material and an adhesive force between the conductive layer and the diffusion barrier structure is from 6 MPa to 15 MPa.

11. A method for manufacturing a conductive laminate, comprising:
    providing a substrate having a surface;
    performing a surface modification on the surface of the substrate to form a discontinuous modifying layer on the surface of the substrate;
    forming a barrier layer on the surface and the discontinuous modifying layer; and
    forming a conductive layer on a surface of the diffusion barrier structure;
    wherein a material for composing the discontinuous modifying layer includes a silane with a hydrophilic group, and a material for composing the barrier layer includes a self-healing polymer; wherein the self-healing polymer is selected from the group consisting of: polyvinyl alcohol, polyvinylpyrrolidone, polyacrylic acid, polyethylene glycol, and any combination thereof.

12. The method according to claim 11, wherein the silane with a hydrophilic group is a silane with an amino group.

13. The method according to claim 12, wherein the silane with the amino group is selected from the group consisting of: (3-aminopropyl)triethoxysilane, N-(3-(trimethoxysilyl)propyl)ethylenediamine), 3-2-(2-aminoethylamino)ethylamino propyl trimethoxysilane, and any combination thereof.

14. The method according to claim 11, wherein the barrier layer further includes a catalytic material.

15. The method according to claim 14, wherein the catalytic material is metallic nanoparticles.

16. The method for manufacturing a conductive laminate according to claim 14, wherein a weight ratio of the self-healing polymer to the catalytic material in the barrier layer is from 0.175:1 to 2:1.

17. The method for manufacturing a conductive laminate according to claim 14, wherein the catalytic material is encapsulated in the self-healing polymer.

18. The method for manufacturing a conductive laminate according to claim 11, wherein a total thickness of the discontinuous modifying layer and the barrier layer is less than 5 nm.

* * * * *